(12) United States Patent
Lee et al.

(10) Patent No.: US 9,478,729 B2
(45) Date of Patent: Oct. 25, 2016

(54) SPIN TRANSFER TORQUE MAGNETIC MEMORY DEVICE USING MAGNETIC RESONANCE PRECESSION AND THE SPIN FILTERING EFFECT

(71) Applicant: Samsung Electronics Co., Ltd., Suwon-si, Gyeonggi-do (KR)

(72) Inventors: Kyung-Jin Lee, Seoul (KR); Soo-Man Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/814,163

(22) Filed: Jul. 30, 2015

(65) Prior Publication Data

US 2015/0340595 A1 Nov. 26, 2015

Related U.S. Application Data

(62) Division of application No. 14/116,959, filed as application No. PCT/KR2012/003345 on Apr. 30, 2012, now abandoned.

(30) Foreign Application Priority Data

May 12, 2011 (KR) ........................ 10-2011-0044587

(51) Int. Cl.
*H01L 29/82* (2006.01)
*H01L 21/02* (2006.01)
(Continued)

(52) U.S. Cl.
CPC ............... *H01L 43/02* (2013.01); *G11C 11/16* (2013.01); *G11C 11/161* (2013.01); *H01L 43/08* (2013.01); *H01L 43/10* (2013.01)

(58) Field of Classification Search
CPC ....... H01L 43/02; H01L 43/08; H01L 43/10; G11C 11/16; G11C 11/161
USPC .......................... 257/421, 295, 329; 365/158
See application file for complete search history.

(56) References Cited

U.S. PATENT DOCUMENTS 8,014,193 B2 9/2011 Nakayama et al.
8,154,913 B2 4/2012 Fukami et al.
(Continued)

FOREIGN PATENT DOCUMENTS

JP 2009-252909 10/2009
JP 2009231753 A 10/2009
(Continued)

OTHER PUBLICATIONS

International Search Report, corresponding Korean Application No. PCT/KR2012/003345; Nov. 16, 2012.

*Primary Examiner* — Dzung Tran
(74) *Attorney, Agent, or Firm* — Myers Bigel & Sibley, P.A.

(57) ABSTRACT

The present invention relates to a magnetic memory device which additionally comprises a free magnetic layer constituting a horizontal direction variable magnetization layer having a fixed saturation magnetization value, whereby a switching current is markedly reduced as compared with conventional magnetic layers such that a high degree of integration of the device can be achieved and it is possible to lower a critical current density necessary for magnetization reversal thereby reducing the power consumption of the device. Also, a stray field effect occurring from a fixed magnetic layer is reduced such that a written magnetization data is thermally stable.

20 Claims, 9 Drawing Sheets

(51) Int. Cl.
*H01L 29/66* (2006.01)
*G11C 11/00* (2006.01)
*H01L 43/02* (2006.01)
*H01L 43/10* (2006.01)
*G11C 11/16* (2006.01)
*H01L 43/08* (2006.01)

(56) References Cited

U.S. PATENT DOCUMENTS

| | | | |
|---|---|---|---|
| 8,279,663 B2 | 10/2012 | Nakayama et al. | |
| 8,338,004 B2 | 12/2012 | Shin et al. | |
| 8,488,375 B2 | 7/2013 | Saida et al. | |
| 2007/0076469 A1* | 4/2007 | Ashida | G11C 11/16 365/158 |
| 2007/0297220 A1* | 12/2007 | Yoshikawa | B82Y 25/00 365/158 |
| 2008/0180991 A1 | 7/2008 | Wang | |
| 2008/0259508 A2 | 10/2008 | Kent et al. | |
| 2009/0015958 A1* | 1/2009 | Nakamura | G11B 5/66 360/55 |
| 2009/0050991 A1* | 2/2009 | Nagai | G11C 11/16 257/421 |
| 2010/0078742 A1* | 4/2010 | Zheng | H01L 29/82 257/421 |
| 2012/0068281 A1* | 3/2012 | Saida | G11C 11/161 257/421 |
| 2013/0181305 A1 | 7/2013 | Nakayama et al. | |

FOREIGN PATENT DOCUMENTS

| | | |
|---|---|---|
| JP | 2010016408 A | 1/2010 |
| JP | 2010-109372 | 5/2010 |
| JP | 2012-064094 | 3/2012 |
| JP | 2012-064904 | 3/2012 |
| JP | 2012064863 A | 3/2012 |
| KR | 10-2004-0092342 | 11/2004 |
| WO | WO 2009/020251 A1 | 2/2009 |
| WO | WO 2009/054180 A1 | 4/2009 |

* cited by examiner (a)

(b)

SPIN TRANSFER TORQUE MAGNETIC MEMORY DEVICE USING MAGNETIC RESONANCE PRECESSION AND THE SPIN FILTERING EFFECT

CROSS-REFERENCE TO RELATED APPLICATION

This application is a divisional application of U.S. application Ser. No. 14/116,959, filed on Jan. 27, 2014, which is a 35 U.S.C. §371 national stage application of PCT International Application No. PCT/KR2012/003345, filed on Apr. 30, 2012, which claims priority to Korean Patent Application No. 10-2011-0044587, filed on May 12, 2011, the disclosures of which are incorporated herein by reference in their entireties.

TECHNICAL FIELD

The present invention relates to a magnetic memory device, and more particularly, to a spin transfer torque magnetic device that induces an alternating current magnetic field in itself in the injection of a current by inserting a free magnetic layer having horizontal anisotropy into a free layer having perpendicular anisotropy and that includes two fixed magnetic layers having magnetization directions opposite to each other not to deteriorate its characteristics by a stray field occurring from a fixed magnetic layer.

BACKGROUND ART

A ferromagnetic material means a material that is spontaneously magnetized even though a strong magnetic field is not applied from the outside. A giant magnetic resistance effect that an electric resistance is changed depending on relative magnetization directions of two magnetic layers occurs in a spin valve structure having a non-magnetic material inserted between two ferromagnetic bodies (a first magnetic material/a non-magnetic material/a second magnetic material). This occurs because electric resistances experienced by up-spin and down-spin are different from each other in the spin valve structure. The giant magnetic resistance effect is widely used as a core technique of a sensor for reading data stored in a hard disk.

While the giant magnetic resistance effect describes a phenomenon that relative magnetization directions of two magnetic layers control the flow of a current, it is also possible to control a magnetization direction of a magnetic layer using an applied current according to the law of action and reaction, which is Newton's third law. A current is applied to the spin valve structure so that a current spin-polarized by the first magnetic material (a fixed magnetic layer) passes through the second magnetic material (a free magnetic layer) to transfer its spin angular momentum. This is called spin-transfer-torque.

International Business Machines Corporation (IBM) suggested a device having a free magnetic layer of which a magnetization is reversed or continuously rotated using the spin-transfer-torque. Thereafter, the device was experimentally identified. In particular, a magnetic memory device using the spin-transfer-torque is spotlighted as a new memory device replaced with a dynamics random access memory (DRAM).

A basic magnetic memory device has the spin valve structure, as described above. In other words, a conventional magnetic memory device 100 has a structure of a lower electrode/a first magnetic material 101 (the fixed magnetic layer)/a non-magnetic material 102/a second magnetic material 103 (the free magnetic layer) of which a magnetization direction is changable by a current/an upper electrode, as shown in the following FIG. 1. The magnetization reversal of the second magnetic material is induced by a current or magnetic field applied from the outside, and a high resistance and a low resistance are shown by the giant magnetic resistance effect described above. These are applied as data of "0" or "1" written in the magnetic memory device.

If an external magnetic field is used in order to control the magnetization of a free layer, a half-selected cell problem occurs with the reduction of a size of a device to limit high integration of the device. On the other hand, if the spin-transfer-torque occurring by applying a voltage to a device is used, the magnetization reversal of a selected cell is easy irrelevantly to a size of a device. According to a physical mechanism of the spin-transfer-torque described above, a magnitude of the spin-transfer-torque occurring in the free magnetic layer is proportional to the amount of an applied current density (or a voltage), and a critical current density for the magnetization reversal of the free magnetic layer exits. If all of the fixed layer and the free layer are composed of a material having perpendicular anisotropy, the critical current density $J_c$ is expressed by the following equation 1.

$$J_c = \frac{2e}{\hbar} \frac{\alpha M_S d}{\eta} (H_{K,eff}) \quad \text{[Equation 1]}$$

In the equation 1, "α" denotes the Gilbert damping constant, "h" (=1.05×10$^{-34}$ J·s) denotes a value obtained by dividing the Planck constant by 2π, "e" (=1.6×10$^{-19}$ C) denotes the quantity of electrical charge of the electron, "η" denotes a spin polarization efficiency constant determined by a material and a structure of a device, "$M_s$" denotes a saturation magnetization of the free magnetic layer, "d" denotes a thickness of the free magnetic layer, and "$H_{K,eff}$" denotes an effective anisotropy magnetic field in a perpendicular direction of a layer ($H_{K,eff}=H_{K\perp}-4\pi M_S$).

If a size of a cell is reduced for high integration of the device, the magnetization direction written by thermal energy at a room temperature is randomly changed. This is a limitation of super-paramagnetism and causes a problem that a written magnetic data is undesirably erased. A mean maintaining time τ of the magnetization direction overcoming the thermal energy is expressed by the following equation 2.

$$\tau = \tau_0 \exp\left(\frac{K_{eff}V}{k_BT}\right) = \tau_0 \exp\left(\frac{H_{K,eff}M_SV}{2k_BT}\right) \quad \text{[Equation 2]}$$

In the equation 2, "$\tau_0$" denotes an inverse number of an attempt frequency and is about 1 ns, "$K_{eff}$" denotes an effective magnetic anisotropy energy density of the free magnetic layer (=$H_{K,eff}M_S/2$), "V" denotes a volume of the device, "$K_B$" denotes the Boltzman's constant (=1.381× 10$^{-16}$ erg/K, and "T" denotes the Kelvin temperature.

Here, "$K_{eff}V/k_BT$" is defined as a thermal stability factor Δ of the magnetic memory device. Generally, a condition of Δ>50 should be satisfied in order that the magnetic memory device maintains its non-volatile characteristic. If the volume V of the free layer is reduced with the reduction of the size of the cell, the $K_{eff}$ should be increased to satisfy the condition of Δ>50. As a result, the $J_c$ increases according to the equation 1.

Thus, because the $\Delta$ and the $J_c$ of the magnetic memory device are proportional to the $K_{eff}$, a sufficient high $\Delta$ and a sufficient low $J_c$ should be satisfied for the commercialization of the device. In addition, because the amount of a current provided in a complementary metal-oxide-semiconductor (CMOS) transistor device is limited, a low critical current density for the magnetization reversal of the free magnetic layer is required. Moreover, the reduction of the critical current density is a necessary factor in order to reduce a power consumption required for driving the device.

In other words, the magnetization reversal critical current density of the free layer should be reduced in order to reduce the size of the memory device and in order to realize high integration of the memory device. Also, the magnetization reversal critical current density of the free layer is reduced so that a power used for writing should be reduced.

As described above, because the critical current density of the magnetic memory device is proportional to the effective magnetic anisotropy magnetic field $H_{K,eff}$, the effective magnetic anisotropy magnetic field $H_{K,eff}$ should be effectively reduced in order to reduce the critical current density of the device. A method of applying a high frequency modulation magnetic field was suggested as the above method. The high frequency modulation magnetic field was applied simultaneously with a magnetic field generated from a writing head of a hard disk drive, thereby reducing a magnitude of a writing magnetic field. This uses a principle that a frequency of an applied AC magnetic field is closer to a resonance frequency of a magnetization of a writing medium to generate the magnetization reversal with a magnetic field lower than an original $H_{K,eff}$. A method of reducing the critical current density by applying the same principle to a current driving magnetic memory device was experimentally verified. However, the principle and the structure surely require an additional device for inducing the modulation magnetic field, and it was confirmed that a reduction effect of a driving power was less effective in an entire device.

Additionally, the magnetization direction of the second magnetic material is varied by the stray field generated from the first magnetic material in the conventional art shown in the following FIG. 1. In more detail, if the magnetization direction of the first magnetic material is a +z-axis being a thickness direction of a layer, a direction of the stray field also becomes the +z-axis. Under this condition, a $\Delta$ in the event that the magnetization direction of the second magnetic material is a −z-axis is smaller than a $\Delta$ in the event that the magnetization direction of the second magnetic material is the +z-axis, due to the influence of the stray field. Since the magnetic memory device has all of the directions being +z and −z directions of the second magnetic material, thermal stability of the magnetization is determined by a smaller $\Delta$ of the two events. Thus, characteristics of the device are deteriorated by the stray field generated from the first magnetic material.

Additionally, if the saturation magnetization value of a magnetic layer is 650 emu/cm$^3$ or more, the influence of a corresponding magnetic layer on a neighboring magnetic layer increases to be likely to cause problems on characteristics of the device.

DISCLOSURE OF THE INVENTION

Technical Problem

Accordingly, the present invention provides a magnetic memory device using spin-transfer-torque and having a lower critical current density and no deterioration of device characteristics caused by a stray field generated from a fixed magnetic layer in order to realize its high integration.

Technical Solution

According to the present invention, there is provided a magnetic memory device including: a first fixed magnetic layer; a first free magnetic layer; and a second free magnetic layer.

The first fixed magnetic layer is a thin layer formed of a material that has a fixed magnetization direction and that is magnetized in a perpendicular direction to a plane of the layer.

The first free magnetic layer is a thin layer formed of a material that has a magnetization direction changed by a current applied from the outside and that is magnetized in a perpendicular direction to a plane of the layer.

The second free magnetic layer is a thin layer formed of a material that has a magnetization direction changed by a current applied from the outside and that is magnetized in a horizontal direction to a plane of the layer.

A first non-magnetic layer and a second non-magnetic layer are disposed between the first fixed magnetic layer and the first free magnetic layer and between the first free magnetic layer and the second free magnetic layer, respectively.

According to an embodiment of the present invention, the magnetic memory device may further include a second fixed magnetic layer; and a third non-magnetic layer between the second free magnetic layer and the second fixed magnetic layer. The second fixed magnetic layer may be a thin layer formed of a material that has a fixed magnetization direction opposite to the first fixed magnetic layer and that is magnetized in a perpendicular direction to a plane of the layer.

Also, a saturation magnetization value of the material magnetized in the horizontal direction may be in a range of 300~2000 kA/m.

According to an embodiment of the present invention, the first fixed magnetic layer and the second fixed magnetic layer may be each independently formed of a material selected from a group consisting of Fe, Co, Ni, B, Si, Zr, Pt, Pd, and a mixture thereof.

Also, the first fixed magnetic layer and the second fixed magnetic layer may be a multi-thin layer consisting of n stacked double layer (n≥1), the double layer may consist of an X layer and a Y layer, and the X layer and the Y layer may be each independently formed of a material selected from a group consisting of Fe, Co, Ni, B, Si, Tb, Zr, Pt, Pd, and a mixture thereof.

According to an embodiment of the present invention, at least one of the first fixed magnetic layer and the second fixed magnetic layer may have an anti-magnetic structure consisting of a first magnetic layer, a non-magnetic layer and a second magnetic layer. The first magnetic layer and the second magnetic layer may be each independently formed of a material selected from a group consisting of Fe, Co, Ni, B, Si, Zr, Pt, Pd, and a mixture thereof.

According to an embodiment of the present invention, at least one of the first magnetic layer and the second magnetic layer may be a multi-thin layer consisting of n stacked double layer (n≥1), the double layer may consist of an X layer and a Y layer, and the X layer and the Y layer may be each independently formed of a material selected from a group consisting of Fe, Co, Ni, B, Si, Zr, Pt, Pd, and a mixture thereof.

According to an embodiment of the present invention, at least one of the first fixed magnetic layer and the second fixed magnetic layer may have an exchange biased antimagnetic structure consisting of an antiferromagnetic layer, a first magnetic layer, a non-magnetic layer and a second magnetic layer. The antiferromagnetic layer may be formed of a material selected from a group consisting of Ir, Pt, Mn, and a mixture thereof. The first magnetic layer and the second magnetic layer may be each independently formed of a material selected from a group consisting of Fe, Co, Ni, B, Si, Zr, Pt, Pd, and a mixture thereof.

According to an embodiment of the present invention, at least one of the first magnetic layer and the second magnetic layer may be a multi-thin layer consisting of n stacked double layer (n≥1), the double layer may consist of an X layer and a Y layer, and the X layer and the Y layer may be each independently formed of a material selected from a group consisting of Fe, Co, Ni, B, Si, Zr, Pt, Pd, and a mixture thereof.

According to an embodiment of the present invention, the first fixed magnetic layer and the second fixed magnetic layer may be formed of different materials from each other and may have different multi-thin layer structures from each other.

According to an embodiment of the present invention, the first free magnetic layer may be formed of a material selected from a group consisting of Fe, Co, Ni, B, Si, Zr, Pt, Pd, and a mixture thereof.

According to another embodiment of the present invention, the first free magnetic layer may be a multi-thin layer consisting of: a layer formed of a material selected from a group consisting of Fe, Co, Ni, B, Si, Zr, Pt, Pd, and a mixture thereof; and a layer consisting of n stacked double layer (n≥1). The double layer may consist of an X layer and a Y layer. The X layer and the Y layer may be each independently formed of a material selected from a group consisting of Fe, Co, Ni, B, Si, Zr, Pt, and Pd.

According to an embodiment of the present invention, the second free magnetic layer may be formed of a material selected from a group consisting of Fe, Co, Ni, B, Si, Zr, and a mixture thereof.

According to another embodiment of the present invention, the first non-magnetic layer, the second non-magnetic layer and the third non-magnetic layer may be formed of different materials from each other. The first non-magnetic layer, the second non-magnetic layer and the third non-magnetic layer may be each independently formed of a material selected from a group consisting of Ru, Cu, Al, Ta, Au, Ag, $AlO_x$, MgO, $TaO_x$, $ZrO_x$, and a mixture thereof.

According to another embodiment of the present invention, electrical conductivities of the first non-magnetic layer, the second non-magnetic layer and the third non-magnetic layer may be higher or lower than those of the first fixed magnetic layer, the first free magnetic layer, the second free magnetic layer and the second fixed magnetic layer.

According to another embodiment of the present invention, the magnetic memory device may further include: an upper electrode and a lower electrode supplying a current to a device.

Advantageous Effects

The magnetic memory device having a new structure according to the present invention further includes the free magnetic layer constituting a horizontal direction variable magnetization layer having a fixed saturation magnetization value, whereby a switching current is markedly reduced as compared with conventional magnetic layers such that a high degree of integration of the device can be achieved and it is possible to lower a critical current density necessary for magnetization reversal thereby reducing a power consumption of the device. Also, a stray field effect occurring from a fixed magnetic layer is reduced such that a written magnetization data is thermally stable.

BRIEF DESCRIPTION OF THE DRAWINGS

In FIG. 7, (b) is a graph showing values obtained by differentiating switching probabilities according to an applied current of the structures of FIGS. 1 and 3 with a current;

BEST MODE FOR CARRYING OUT THE INVENTION

Figure 1:
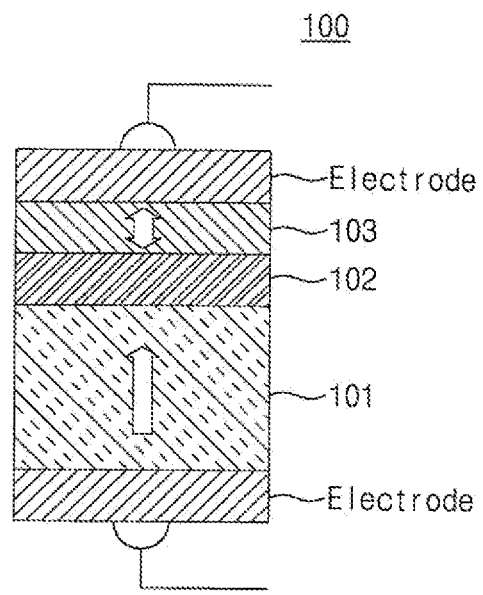
FIG. 1 is a cross-sectional view showing a structure of a conventional magnetic memory device using spin-transfer-torque

Hereinafter, the present invention will be described in detail.

According to the present invention, in a magnetic memory device, thermal stability is maintained and a critical current density is reduced to reduce a device size. Thus, high integration is realized and usage power consumption is reduced in writing. Additionally, characteristics of the device are not deteriorated by a stray field generated from a fixed magnetic layer. To achieve these, the present invention provides a new structural magnetic memory device that induces an alternating current (AC) magnetic field in itself and controls this.

A magnetic memory device 200 according to an embodiment of the present invention includes a fixed magnetic layer 201, a first non-magnetic layer 202, a first free magnetic layer 203, a second non-magnetic layer 204 and a second free magnetic layer 205. The fixed magnetic layer is a thin layer formed of a material that has a fixed magnetization direction and that is magnetized in a perpendicular direction to a plane of the layer. The first free magnetic layer is a thin layer formed of a material that has a magnetization direction changed by a current applied from the outside and that is magnetized in a perpendicular direction to a plane of the layer. The second free magnetic layer is a thin layer formed of a material that has a magnetization direction changed by a current applied from the outside and that is magnetized in a horizontal direction to a plane of the layer.

In other words, the second free magnetic layer 205 having horizontal anisotropy is additionally inserted in the first free magnetic layer 203 having perpendicular anisotropy, so that the magnetization of the second free magnetic layer is rotated by a spin-transfer-torque effect when a current is applied and so that a direct current (DC) is applied to rotate the magnetization in a plane of the free layer with a high frequency. As a result, an alternating current (AC) magnetic field having the high frequency is autonomously generated to be possible to effectively reduce the critical current density of the device.

Also, a magnetic memory device 300 according to another embodiment of the present invention includes a first fixed magnetic layer 301, a first non-magnetic layer 302, a first free magnetic layer 303, a second non-magnetic layer 304, a second free magnetic layer 305, a third non-magnetic layer 306 and a second fixed magnetic layer 307. The first and second fixed magnetic layers are thin layers formed of materials that have fixed magnetization directions opposite to each other and that are magnetized in a perpendicular direction to planes of the layers. The first free magnetic layer is a thin layer formed of a material that has a magnetization direction changed by a current applied from the outside and that is magnetized in a perpendicular direction to a plane of the layer. The second free magnetic layer is a thin layer formed of a material that has a magnetization direction changed by a current applied from the outside and that is magnetized in a horizontal direction to a plane of the layer.

In other words, the second free magnetic layer 305 having horizontal anisotropy is additionally inserted in the first free magnetic layer 303 having perpendicular anisotropy, so that the second free magnetic layer performs a precessional motion through the spin-transfer-torque effect to generate a high frequency alternating current (AC) magnetic field. The high frequency alternating current (AC) magnetic field is possible to reduce the critical current density of the device.

Also, the alternating current (AC) magnetic field by the precessional motion of the second free magnetic layer is determined depending on the current applied from the outside and an effective magnetic field of the second free magnetic layer. In particular, since the second fixed magnetic layer is inserted, an induced magnetic field may be generated in the perpendicular direction to the plane of the second free magnetic layer. Thus, the precessional motion of the second free magnetic layer may be controlled depending on a structure and a physical property value of the second fixed free layer. In other words, it is possible to control the alternating current magnetic field generated in the device by a structure and a physical property value of the device as well as an external current.

Also, the magnetization direction of the first fixed magnetic layer and the magnetization direction of the second fixed magnetic layer may be controlled to reduce the stray field applied to the first free magnetic layer as compared with a conventional device. Thus, the thermal stability of magnetization data written in the device may be improved.

Figure 2:
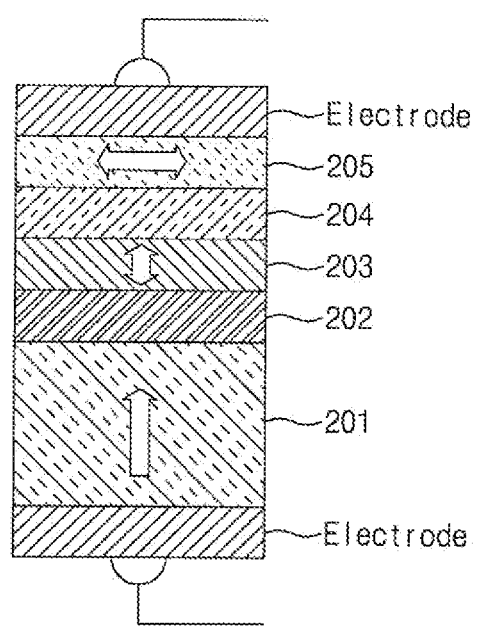
FIG. 2 is a cross-sectional view showing a structure of a magnetic memory device using spin-transfer-torque according to an embodiment of the present invention.

The following FIG. 2 is a cross-sectional view showing a structure of a spin-transfer-torque magnetic memory device 200 according to an embodiment of the present invention. The device according to the present invention basically has a structure including a lower electrode, a fixed magnetic layer 201 having magnetization of a perpendicular direction, a first non-magnetic layer 202, a first free magnetic layer 203 having perpendicular anisotropy and a magnetization direction changed by a current, a second non-magnetic layer 204, a second free magnetic layer 205 having horizontal magnetization and a magnetization direction changed by a current, and an upper electrode.

In the first free magnetic layer 203, a perpendicular crystal anisotropy magnetic field ($H_{K\perp}=2K_\perp/M_S$) capable of standing the magnetization perpendicularly is generally remarkably greater than a shape anisotropy magnetic field ($H_d=4\pi M_S$) capable of laying the magnetization horizontally such that the magnetization direction is stabilized in the perpendicular direction of the layer. (i.e., $H_{K,eff}=H_{K\perp}-H_d=H_{K\perp}-4\pi M_S>0$)

In the second free magnetic layer 205, a shape anisotropy magnetic field is remarkably greater a magnetic anisotropy magnetic field such that the magnetization direction is stabilized in the plane of the layer. Thus, a great angle is maintained between the magnetizations of the first free magnetic layer 203 and the second free magnetic layer 205 in a condition that a current is not applied.

If a current is applied for magnetization switching, the first free magnetic layer 203 receives spin-transfer-torque from electrons that are spin-polarized by the fixed magnetic layer 201. Also, since the second non-magnetic layer 204 is disposed between the first free magnetic layer 203 and the second free magnetic layer 205, the second free magnetic layer 205 receives spin-transfer-torque from electrons that are spin-polarized by the first free magnetic layer 203. In other words, if a voltage is applied to the magnetic memory device, the magnetization of the second free magnetic layer 205 receives the spin-transfer-torque close to perpendicular such that the magnetization of the second free magnetic layer 205 is rotated at high speed.

Thus, the second free magnetic layer 205 rotated at the high speed provides a modulation magnetic field to the device, thereby obtaining an effect that effectively reduces a critical current density of the first free magnetic layer 203. If a total resistance of the device is low, a larger amount of the current flows by the same applying voltage to reduce a power required for magnetization reversal. The first non-magnetic layer 202 and the second non-magnetic layer 204 may use a metal having remarkably high electrical conductivity.

Figure 3:
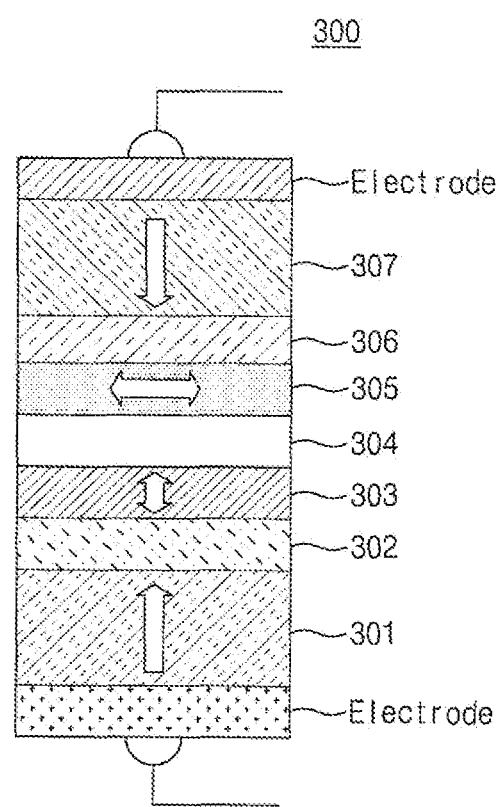
FIG. 3 is a cross-sectional view showing a structure of a magnetic memory device using spin-transfer-torque according to another embodiment of the present invention.

The following FIG. 3 is a cross-sectional view showing a structure of a spin-transfer-torque magnetic memory device 300 according to another embodiment of the present invention. The device according to the present invention basically has a structure including a lower electrode, a first fixed magnetic layer 301 having magnetization of a perpendicular direction, a first non-magnetic layer 302, a first free magnetic layer 303 having perpendicular anisotropy and a magnetization direction changed by a current, a second non-magnetic layer 304, a second free magnetic layer 305 having horizontal anisotropy and a magnetization direction changed by a current, a third non-magnetic layer 306, a second fixed magnetic layer 307 having magnetization of a perpendicular direction, and an upper electrode.

In the first free magnetic layer 303, a perpendicular crystal anisotropy magnetic field ($H_{K\perp}=2K_\perp/M_S$) capable of standing the magnetization perpendicularly is remarkably greater than a shape anisotropy magnetic field ($H_d=4\pi M_S$) capable of laying the magnetization horizontally such that the magnetization direction is stabilized in the perpendicular direction to the plane of the layer. (i.e., $H_{K,eff}=H_{K\perp}-H_d=H_{K\perp}-4\pi M_S>0$) On the other hand, the second free magnetic layer 305 is stabilized in the plane of the layer by a shape anisotropy magnetic field. As a result, a great angle is maintained between the magnetizations of the two free magnetic layers even though an external magnetic field or a current is not applied.

If a current is applied for magnetization reversal, the first free magnetic layer 303 receives spin-transfer-torque from a current spin-polarized by the first fixed magnetic layer 301. Also, since the second non-magnetic layer 304 is disposed between the first free magnetic layer 303 and the second free magnetic layer 305, the second free magnetic layer 305 receives spin-transfer-torque from a current spin-polarized by the first free magnetic layer 303. Thus, if a voltage is applied to the magnetic memory device, the magnetization of the second free magnetic layer 305 receives the spin-transfer-torque of a component close to perpendicular such that the magnetization is rotated at high speed.

Also, since the third non-magnetic material 306 is disposed between the second free magnetic layer 305 and the second fixed magnetic layer 307, spin-transfer-torque and an induced magnetic field are received from a current spin-polarized by the second fixed magnetic layer 307, and they are parallel or anti-parallel to each other by the applied current and act in a perpendicular direction to the plane of the layer. A frequency and a magnitude of the high alternating current (AC) magnetic field are influenced.

Thus, the second free magnetic layer 305 rotated at the high speed provides a modulation magnetic field to the device, thereby obtaining an effect that effectively reduces a critical current density of the first free magnetic layer 303. The modulation magnetic field may be effectively controlled using the current and the induced magnetic field applied through the second fixed magnetic layer. Also, the magnetization direction of the first fixed magnetic layer and a relative magnetization direction of the second fixed magnetic layer may be controlled to reduce a stray field applied to the first free magnetic layer as compared with a conventional device. Thus, the thermal stability of magnetization data written in the device may be improved.

The first non-magnetic layers 202 and 302, the second non-magnetic layers 204 and 304 and the third non-magnetic layer 306 may use a metal having a remarkably high electrical conductivity. Additionally, a material having remarkably low electrical conductivity may be used. In this case, a current may be reduced under the same voltage but a magnetic resistance difference according to magnetization rotation by a tunneling effect of electrons may become very great to obtain a high magnetic resistance ratio. Thus, the material having remarkably low electrical conductivity may be used in at least one of the first non-magnetic layer 202, the second non-magnetic layer 204 and the third non-magnetic layer 206 or in all of the three non-magnetic layers.

In the magnetic memory device according to the present invention, a structure having a size as small as possible should be realized using a patterning technique in order to obtain a high current density. At this time, it is preferable that a section of the device is close to a circle. Thus, magnetic shape anisotropy in a plane is the same in any direction such that the high speed rotation of the magnetizations of the first free magnetic layers 203 and 303 and the second free magnetic layers 205 and 305.

Hereinafter, the present invention will be described in more detail through preferred embodiments. However, the present invention is not limited to the embodiments. In other words, the present invention is not limited to the following experimental conditions and kinds of materials, etc.

MODE FOR CARRYING OUT THE INVENTION

Embodiment

The effect of the magnetic memory device according to the present invention was confirmed through micro-magnetic modeling using an equation of motion of magnetization. The justification of this method was efficiently secured through a conventional computer hard disk development and spin-transfer-torque research.

The equation of motion of the magnetization is expressed by the following equation 3.

$$\frac{\partial m_1}{\partial t} = -\gamma(m_1 \times H_2^{eff}) + \alpha m_1 \times \frac{\partial m_1}{\partial t} -$$
$$\frac{\gamma \hbar \eta_1 j_e}{2eM_{S1}d_1}m_1 \times (m_1 \times p_1) + \frac{\gamma \hbar j_e \eta_{2\to 1}}{2eM_{S1}d_1}m_1 \times (m_1 \times m_2)$$
$$\frac{\partial m_2}{\partial t} = -\gamma(m_2 \times H_2^{eff}) + \alpha m_2 \times \frac{\partial m_2}{\partial t} -$$
$$\frac{\gamma \hbar \eta_2 j_e}{2eM_S d_2}m_2 \times (m_2 \times m_1) + \frac{\gamma \hbar \eta_3 j_e}{2eM_{S2}d_2}m_1 \times (m_1 \times p_2)$$
$$p_1 = \hat{z},$$
$$p_2 = \hat{z}$$

[Equation 3]

In the equation 3,
"m1" and "m2" denote unit magnetization vectors of the first free magnetic layer 203 and 303 and the second free magnetic layer 205 and 305, respectively, "$\gamma$" denotes a magnetic rotational constant, "$H_1^{eff}$" and "$H_2^{eff}$" denotes entire effective magnetic field vectors of the first free magnetic layer 203 and 303 and the second free magnetic layer 205 and 305, respectively, "$\alpha$" denotes the Gilbert damping constant, "h" ($=1.05\times10^{-34}$ J·s) denotes a value obtained by dividing the Planck constant by $2\pi$, "e" ($=1.6\times10^{-19}$ C) denotes the quantity of electrical charge of the electron, "$\eta_1$", "$\eta_2$" and "$\eta_3$" denote spin polarization efficiency constants of the first free magnetic layer 203 and 303 and the second free magnetic layer 205 and 305 determined by a material and an entire structure of a device, "$J_e$" denotes an applied current density, "$M_{S1}$" and "$M_{S2}$" denote saturation magnetization values of the first free magnetic layer 203 and 303 and the second free magnetic layer 205 and 305, and "$d_1$" and "$d_2$" denote thicknesses of the first free magnetic layer 203 and 303 and the second free magnetic layer 205 and 305, respectively. "$P_1$" denotes a unit vector showing a spin direction of a spin polarization current inputted from the first fixed magnetic layer 201 and 301 into the first free magnetic layer 203 and 303, and "$P_2$" denotes a unit vector showing a spin direction of a spin polarization current inputted from the second fixed magnetic layer 307 into the second free magnetic layer 305. Here, "$P_1$" and "$P_2$" are unit vectors parallel to a z-axis corresponding to a thickness direction of a layer.

Experimental Example 1

Magnetization Behavior of First Free Magnetic Layer and Second Free Magnetic Layer According to a Time Caused by Applying a Current to the Device According to the Present Invention (1) There is illustrated magnetization behavior of the first free magnetic layer having the perpendicular anisotropy and the second free magnetic layer having the horizontal anisotropy when the current is applied to the magnetic memory device according to an embodiment of the present invention as shown in the following FIG. 2.

(2) Structure and physical property values of the device are as follows:

sectional area of an entire structure=314 nm$^2$, fixed magnetic layer 201/first non-magnetic layer 202/first free magnetic layer 203: "thickness (t)=3 nm, perpendicular anisotropy constant ($K_\perp$)=6×10$^6$ erg/cm$^3$, saturation magnetization value ($M_{S1}$)=1000 emu/cm$^3$, Gilbert damping constant ($\alpha$)=0.01, and spin polarization efficiency constant ($\eta_1$)=1.0", second non-magnetic layer 204: thickness t=1 nm, and second free magnetic layer 205: "thickness (t)=1 nm, perpendicular anisotropy constant ($K_\perp$)=0 erg/cm$^3$, saturation magnetization value ($M_{S2}$)=700 emu/cm$^3$, Gilbert damping constant ($\alpha$)=0.01, and spin polarization efficiency constant ($\eta_2$)=1.0".

Figure 4A:
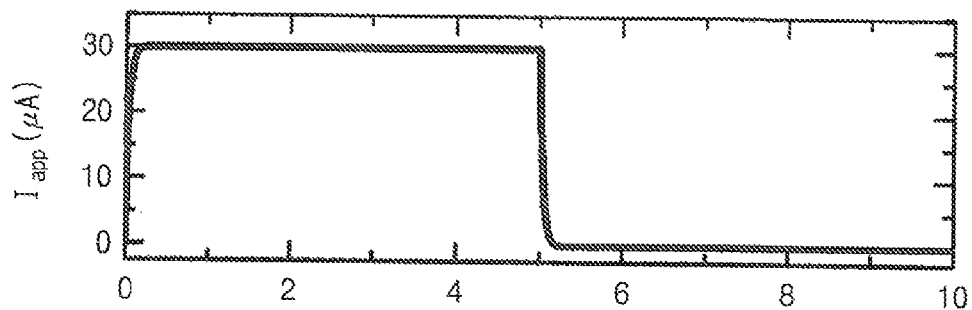
FIG. 4A is a graph showing an applied current according to a time in the device of FIG. 2.

(3) The following FIG. 4A is a graph showing an applied current according to a time. A current pulse having a rise time of 40 ps and a width of 5 ns was applied in order to observe switching behavior of the magnetization.

Figure 4B:
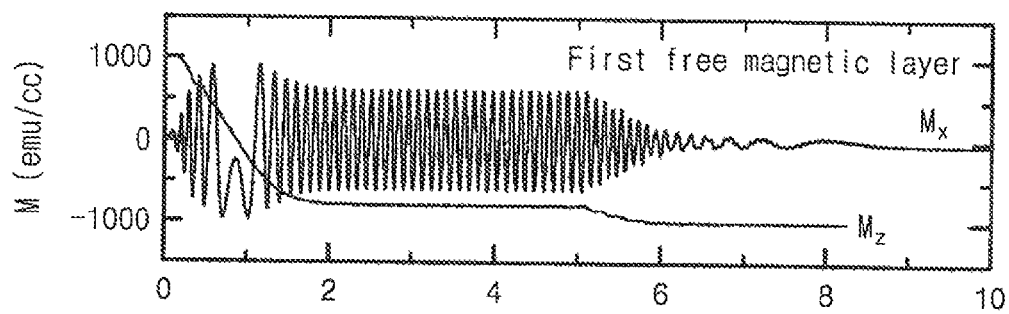
FIG. 4B is a graph showing magnetization behavior of a first free magnetic layer according to a time in the device of FIG. 2.

The following FIG. 4B is a graph showing the magnetization behavior of the first free magnetic layer 203 according to a time.

Referring to the following FIG. 4B, an x-component being a horizontal direction to the plane of the layer oscillates according to the time, and a z-component is changed from +1000 emu/cm$^3$ to −1000 emu/cm$^3$ at a time (t) of about 1 ns. This means that a magnetization component is switched by the applied current.

Figure 4C:
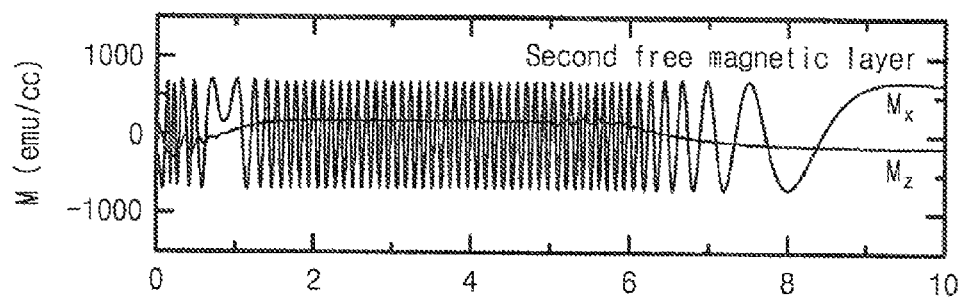
FIG. 4C is a graph showing magnetization behavior of a second free magnetic layer according to a time in the device of FIG. 2.

The following FIG. 4C is a graph showing magnetization behavior of the second free magnetic layer 205 according to a time.

Referring to the following FIG. 4C, a component in a plane (i.e., an x-axis component) of the magnetization of the second free magnetic layer 205 is very greater than a perpendicular component (i.e., an z-axis component) of the magnetization of the second free magnetic layer 205, and the second free magnetic layer 205 shows behavior oscillating according to a time with the same period as the magnetization of the first free magnetic layer 203. The oscillation (i.e., precessional motion) according to the time of the second free magnetic layer 205 occurs by perpendicular directional spin torque spin-polarized by the first free magnetic layer 203 magnetized in a perpendicular direction when the current is applied to the entire structure.

Figure 4D:
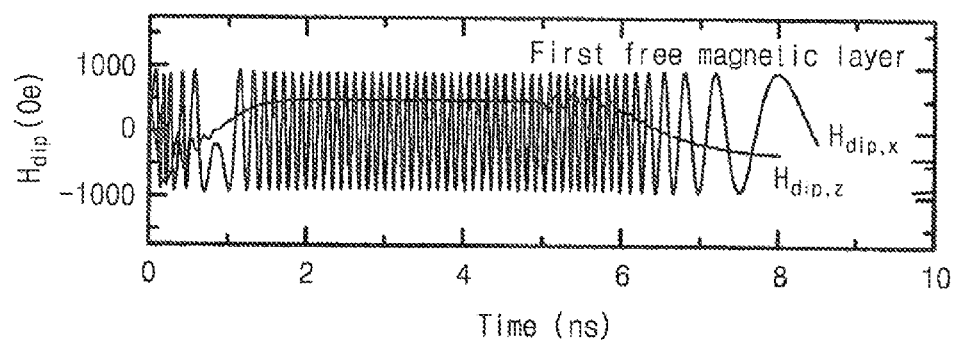
FIG. 4D is a graph showing an alternating current (AC) magnetic field occurring in a first free magnetic layer according to a precessional motion of a second free magnetic layer in the device of FIG. 2.

The following FIG. 4D is a graph showing an alternating current (AC) magnetic field generated in the first free magnetic layer 203 by the precessional motion of the second free magnetic layer 205 according to the time. The alternating current (AC) magnetic field is a magnetic field that is generated by the magnetization of the second free magnetic layer 205 in a position of the first free magnetic layer 203. This occurs because of the precessional motion of the magnetization of the second free magnetic layer 205 according to the time.

Referring to the following FIG. 4D, the alternating current (AC) magnetic field having an x-component and a magnitude of about 200 Oe is autonomously generated in the magnetic memory device structure according to the present invention. Thus, the device structure according to the present invention does not require an external additional element generating an alternating current (AC) magnetic field in order to reduce a current density for reversing the magnetization of the first free magnetic layer 203, unlike a conventional device structure.

In other words, since the component in the plane of the second free magnetic layer 205 does the precessional motion, the x-component of the alternating current (AC) magnetic field induced in the first free magnetic layer is very greater than a z-component of the alternating current (AC) magnetic field. As a result, the induced magnetic field reduces anisotropy energy of a magnetization easy axis (z-axis) of the first free magnetic layer 203 such that the magnetization switching of the first free magnetic layer 203 is easy.

Experimental Example 2

Measurement of Switching Probabilities with Respect to Currents Applied to a Device According to the Present Invention and a Device According to a Conventional Structure (1) There are illustrated switching currents with respect to the conventional structure of FIG. 1 and the new structure according to the present invention of FIG. 2.

(2) Structure and physical property values of the devices are as follows.

A sectional area of an entire structure of each of the two structures is 314 nm$^2$.

The conventional structure of FIG. 1 has fixed magnetic layer 101/non-magnetic layer 102/free magnetic layer 103: "thickness (t)=3 nm, perpendicular anisotropy constant ($K_\perp$)=6×10$^6$ erg/cm$^3$, saturation magnetization value ($M_{S1}$)=1000 emu/cm$^3$, Gilbert damping constant ($\alpha$)=0.01, and spin polarization efficiency constant ($\eta_1$)=1.0".

The physical property values of the new structure according to the present invention are as follows:

fixed magnetic layer 201/first non-magnetic layer 202/first free magnetic layer 203: "thickness (t)=3 nm, perpendicular anisotropy constant ($K_\perp$)=6×10$^6$ erg/cm$^3$, saturation magnetization value ($M_{S1}$)=1000 emu/cm$^3$, Gilbert damping constant ($\alpha$)=0.01, and spin polarization efficiency constant ($\eta_1$)=1.0", second non-magnetic layer 204: thickness t=1 nm, and second free magnetic layer 205: "thickness (t)=1 nm, perpendicular anisotropy constant ($K_\perp$)=0 erg/cm$^3$, saturation magnetization value ($M_{S2}$)=700 emu/cm$^3$, Gilbert damping constant ($\alpha$)=0.01, and spin polarization efficiency constant ($\eta_2$)=1.0".

The fixed magnetic layer, the non-magnetic layer and the free magnetic layer of the conventional structure have the same structures and the same physical property values as the fixed magnetic layer, the first non-magnetic layer and the first free magnetic layer of the new structure according to the present invention.

(3) In the present experimental example, a temperature of the device is 300K, and the experiment was repeated 100 times with respect to each applied current, thereby measuring probability of magnetization switching.

Figure 5A:
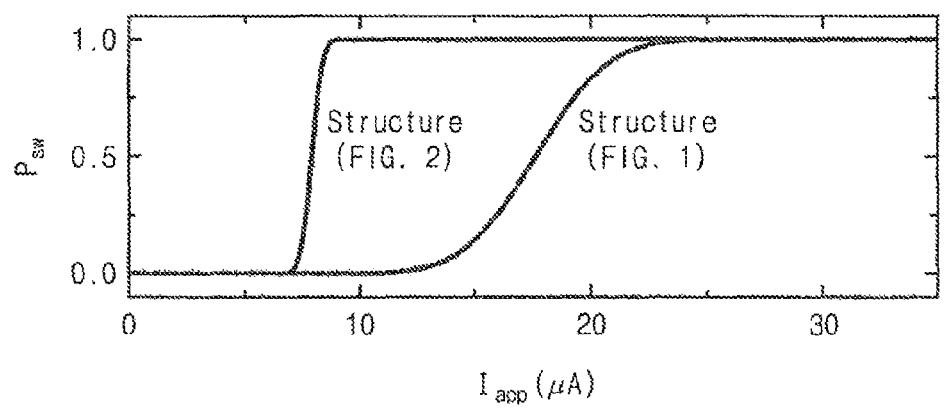
FIG. 5A is a graph showing switching probabilities according to an applied current of the structures of FIGS. 1 and 2.

The following FIG. 5A is a graph showing switching probabilities $P_{SW}$ according to applied currents of the new structure (FIG. 2) according to the present invention and the conventional structure (FIG. 1).

Referring to the following FIG. 5A, a switching current is defined as a current having a switching probability $P_{SW}$ of 0.5. The switching current of the new structure was 7.9 µA and the switching current of the conventional structure was 17.6 µA. In other words, this means that the switching current is reduced by about 55%.

Figure 5B:
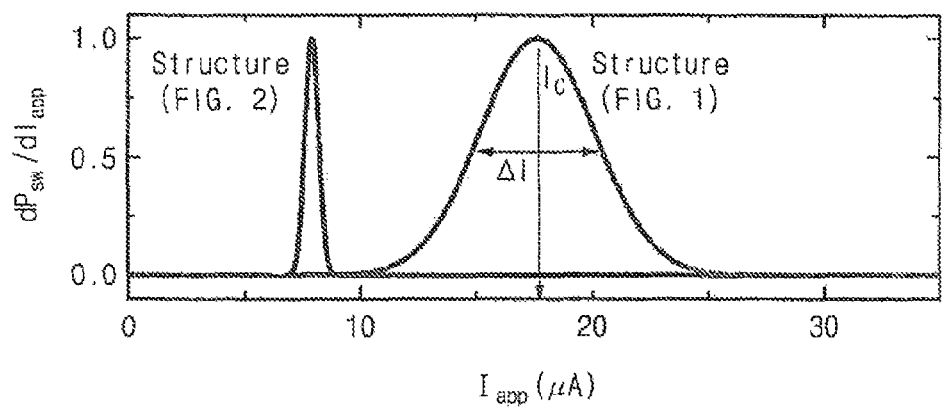
FIG. 5B is a graph showing values obtained by differentiating switching probabilities according to an applied current of the structures of FIGS. 1 and 2 with a current.

The following FIG. 5B is a graph showing values obtained by differentiating the switching probabilities shown in FIG. 5A with a current.

Referring to the following FIG. 5B, a Q-factor is a value obtained by dividing an x-axis value of a peak by a width of a distribution functions at a position having a y-axis value of 0.5 (i.e., full width half maximum (FWHM)) in a general probability distribution. In the present experimental example, the Q-factor is defined as $I_c/\Delta I$. The Q-factor of the new structure of FIG. 2 according to the present invention is 13.5, and the Q-factor of the conventional structure of FIG. 1 is 3.6.

In other words, the high Q-factor of the magnetic memory device structure according to the present invention means that the switching probability distribution is small. This means that dispersion of the current applied for changing a magnetization state is small. Thus, the magnetic memory device structure according to the present invention is excellent in commercialization.

Experimental Example 3

Measurement of a Switching Current According to a Saturation Magnetization Value of the Second Free Magnetic Layer 205 in the Device According to the Present Invention (1) There is illustrated variation of the switching current according to the saturation magnetization value ($M_{S2}$) of the second free magnetic layer 205 in the new structure according to the present invention.

(2) Structure and physical property values of the device are as follows:

sectional area of an entire structure=314 nm², fixed magnetic layer 201/first non-magnetic layer 202/first free magnetic layer 203: "thickness (t)=3 nm, perpendicular anisotropy constant ($K_⊥$)=6×10⁶ erg/cm³, saturation magnetization value ($M_{S1}$)=1000 emu/cm³, Gilbert damping constant (α)=0.01, and spin polarization efficiency constant ($η_1$)=1.0", second non-magnetic layer 204: thickness t=1 nm, and second free magnetic layer 205: "thickness (t)=1 nm, perpendicular anisotropy constant ($K_⊥$)=0 erg/cm³, saturation magnetization value ($M_{S2}$)=0~2000 emu/cm³, Gilbert damping constant (α)=0.01, and spin polarization efficiency constant ($η_2$)=0~1.0".

In the present experimental example, a temperature of the device is 300K, and switching probability was measured after the experiment was repeated 100 times with respect to each applied current like the experimental example 2.

Figure 6:
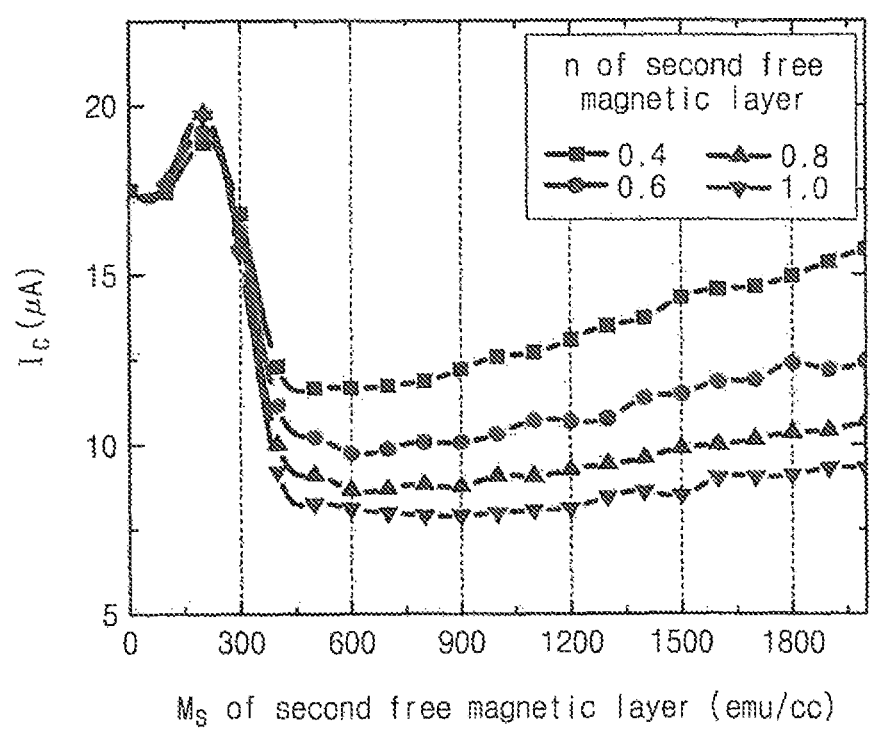
FIG. 6 is a graph showing a switching current of a magnetic memory device according to a saturation magnetization value and a spin polarization efficiency of a second free magnetic layer in the device of FIG. 2.

The following FIG. 6 is a graph showing a switching current with respect to the saturation magnetization value and the spin polarization efficiency of the second free magnetic layer 205.

Referring to the following FIG. 6, the switching current is varied according to the saturation magnetization value ($M_{S2}$) of the second free magnetic layer 205 having the horizontal anisotropy. Here, a case having the saturation magnetization value ($M_{S2}$) of 0 emu/cm³ corresponds to a structure not including the second free magnetic layer, i.e., the conventional magnetic memory device structure of FIG. 1. According to the present invention, if the saturation magnetization value ($M_{S2}$) is 300 emu/cm³ or more, the switching current is reduced as compared with the conventional structure regardless of the spin polarization efficiency of the second free magnetic layer 205. In particular, the reduction effect of the switching current is greatest when the saturation magnetization value ($M_{S2}$) is in a range of 300 emu/cm³ to 500 emu/cm³.

As described above, the induced alternating current (AC) magnetic field of the second free magnetic layer 205 is required in order to reduce the switching current of the first free magnetic layer 203. As described in the present experimental example, the reduction effect of the switching current density is produced when the saturation magnetization value ($M_{S2}$) of the second free magnetic layer 205 is 300 emu/cm³ or more.

The new magnetic memory device structure according to the present invention includes the second free magnetic layer 205 having the saturation magnetization value equal to or greater than a certain value and the horizontal anisotropy such that the switching current is effectively reduced as compared with the conventional structure.

Experimental Example 4

Measurement of Switching Probabilities According to Applied Currents of a Device According to a Conventional Structure and a Device According to the Present Invention There are illustrated switching probabilities according to applied currents of the conventional structure of FIG. 1 and the device of the new structure of FIG. 3 according to the present invention.

Structures and physical property values of the devices are as follows.

A sectional area of an entire structure of each of the two structures is 314 nm².

The conventional structure of FIG. 1 has fixed magnetic layer 101/non-magnetic layer 102/free magnetic layer 103 (thickness (t)=3 nm, perpendicular anisotropy constant ($K_⊥$)=7×10⁵ J/m³, saturation magnetization value ($M_{S1}$)=1100 kA/m, Gilbert damping constant (α)=0.01, and spin polarization efficiency constant ($η_1$)=1.0).

The new structure according to the present invention of FIG. 3 has first fixed magnetic layer 301/first non-magnetic material 302 (thickness (t)=1 nm)/first free magnetic layer 303 (thickness (t)=3 nm, perpendicular anisotropy constant ($K_⊥$)=7×10⁵ J/m³, saturation magnetization value ($M_{S1}$)=1100 kA/m, Gilbert damping constant (α)=0.01, and spin polarization efficiency constant ($_1$)=1.0)/second non-magnetic layer 304 (thickness (t)=1 nm)/second free magnetic layer 305 (thickness (t)=1 nm, perpendicular anisotropy constant (K)=0 erg/, saturation magnetization value ($M_{S2}$)=800/m, Gilbert damping constant (α)=0.01, spin polarization efficiency constant by first free magnetic layer ($\eta_2$)=1.0, spin polarization efficiency constant by second fixed magnetic layer ($\eta_3$)=0)/third non-magnetic layer 306 (thickness (t)=1 nm)/second fixed magnetic layer 307 (thickness (t)=3 nm, saturation magnetization value ($M_S$)=1100 kA/m). Thus, the fixed layer, the non-magnetic layer and the free magnetic layer of the conventional structure have the same structures and the same physical property values as the first fixed magnetic layer, the first non-magnetic layer and the first free magnetic layer of the new structure according to the present invention.

(3) In the present experimental example, a temperature of the device is 300 k, and the experiment was repeated 100 times with respect to each applied current to measure a probability of the magnetization direction of the free layer (first free layer) switched from an initial direction to an opposite direction.

Figure 7:
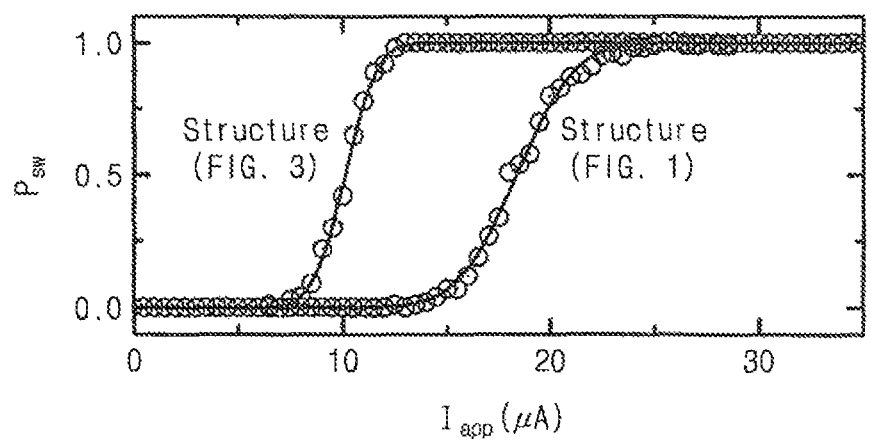
In FIG. 7, (a) is a graph showing switching probabilities according to an applied current of the structures of FIGS. 1 and 3.
Figure 7:
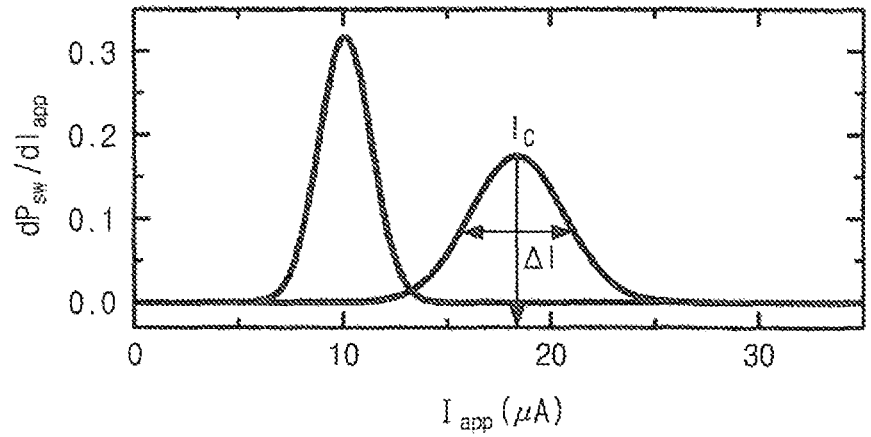

"(a)" of the following FIG. 7 is a graph showing switching probabilities ($P_{SW}$) according to the applied currents of the new structure according to the present invention of FIG. 3 and the conventional structure of FIG. 1. Here, a full line shows values obtained by fitting the following equation 4. The following equation 4 is a cumulative distribution function.

$$P_{SW} = \frac{1}{2}\left\{1 + \text{erf}\left(\frac{I_{opp} - I_{SW}}{\sigma\sqrt{2}}\right)\right\}$$ [Equation 4]

In the equation 4, "$I_{opp}$" denotes an applied current density, "$I_{SW}$" denotes a switching current density, and "$\sigma$" denotes standard deviation of probability distribution.

Referring to (a) of the following FIG. 7, a switching current is defined as a current having a switching probability $P_{SW}$ of 0.5 and is obtained by fitting the equation 4. The switching current is 10.1 µA in the structure according to the present invention, and the switching current is 18.36 µA in the conventional structure. In other words, the switching current of the magnetic memory device applied with the structure according to the present invention was reduced by about 45%.

"(b)" of the following FIG. 7 is a graph showing values obtained by differentiating switching probabilities $P_{SW}$ according to applied currents of the conventional structure of FIG. 1 and the new structure according to the present invention of FIG. 3 with a current.

Referring to (b) of the following FIG. 7, a Q-factor is a value obtained by dividing an x-axis value of a peak by a width of a distribution functions at a position having a y-axis value of 0.5 (i.e., full width half maximum (FWHM)) in a general probability distribution. In the present experimental example, the Q-factor is defined as $I_{SW}/\Delta I$. The Q-factor of the new structure of FIG. 3 according to the present invention is 7.14 and the Q-factor of the conventional structure of FIG. 1 is 3.43. Also, the standard deviation σ is obtained from the equation 4. The standard deviation σ of the new structure is 1.21 and the standard deviation σ of the conventional structure is 2.26

The magnetic memory device structure according to the present invention has a characteristic of the high Q-factor. Thus, the dispersion of the current required to change the magnetization state is small in the new structure. This is an excellent characteristic for commercialization.

Experimental Example 5

Measurement of a Switching Current of a Device According to a Conventional Structure and a Switching Current and a Distribution According to the Saturation Magnetization Value of the Second Free Magnetic Layer 305 of the Device According to the Present Invention (1) There are illustrated a switching current and a distribution of the conventional structure of FIG. 1.

(2) There is illustrated variation of a switching current and a distribution according to the saturation magnetization value $M_{S2}$ of the second free magnetic layer 305 of the device having the new structure according to the present invention.

Structures and physical property values of the devices are as follows.

A sectional area of an entire structure of each of the two structures is 314 nm$^2$.

The conventional structure of FIG. 1 has fixed magnetic layer 101/non-magnetic layer 102/free magnetic layer 103 (thickness (t)=3 nm, perpendicular anisotropy constant ($K_\perp$)=7×10$^5$ J/m$^3$, saturation magnetization value ($M_{S1}$)=1100 kA/m, Gilbert damping constant (α)=0.01, and spin polarization efficiency constant ($\eta_1$)=1.0). In other words, the conventional structure of FIG. 1 has the same structure and the same physical property values as considered in the experimental example 1.

The new structure according to the present invention of FIG. 3 has first fixed magnetic layer 301/first non-magnetic material 302 (thickness (t)=1 nm)/first free magnetic layer 303 (thickness (t)=3 nm, perpendicular anisotropy constant ($K_\perp$)=7×10$^5$ J/m$^3$, saturation magnetization value ($M_{S1}$)=1100 kA/m, Gilbert damping constant (α)=0.01, and spin polarization efficiency constant ($\eta_1$)=1.0)/second non-magnetic layer 304 (thickness (t)=1 nm)/second free magnetic layer 305 (thickness (t)=1 nm, perpendicular anisotropy constant (K)=0 J/m$^3$, saturation magnetization value ($M_{S2}$)=0~1500 kA/m, Gilbert damping constant (α)=0.01, spin polarization efficiency constant by first free magnetic layer ($\eta_2$)=1.0, spin polarization efficiency constant by second fixed magnetic layer ($\eta_3$)=0)/third non-magnetic layer 306 (thickness (t)=1 nm)/second fixed magnetic layer 307 (thickness (t)=3 nm, saturation magnetization value ($M_S$)=1100 kA/m).

(4) In the present experimental example, a temperature of the device is 300 k, and the experiment was repeated 100 times with respect to each applied current to measure a probability of the magnetization direction of the free layer (first free layer) switched from an initial direction to an opposite direction.

(5) Two switching cases occur depending on relative directions of a fixed magnetic layer and a free magnetic layer in a magnetic memory device.

In a "P-to-AP" case, relative directions of the free magnetic layer (the first free magnetic layer) and the fixed magnetic layer (the first fixed magnetic layer) are parallel to each other before a current is applied, and the magnetization switching of the free magnetic layer (the first free magnetic layer) occurs by an applied current such that the magnetization directions of the free and fixed magnetic layers (the first free and fixed magnetic layers) are arranged to be anti-parallel to each other.

In an "AP-to-P" case, relative directions of the free magnetic layer (the first free magnetic layer) and the fixed magnetic layer (the first fixed magnetic layer) are anti-parallel to each other before a current is applied, and the magnetization switching of the free magnetic layer (the first free magnetic layer) occurs by an applied current such that the magnetization directions of the free and fixed magnetic layers (the first free and fixed magnetic layers) are arranged to be parallel to each other.

Figure 8A:
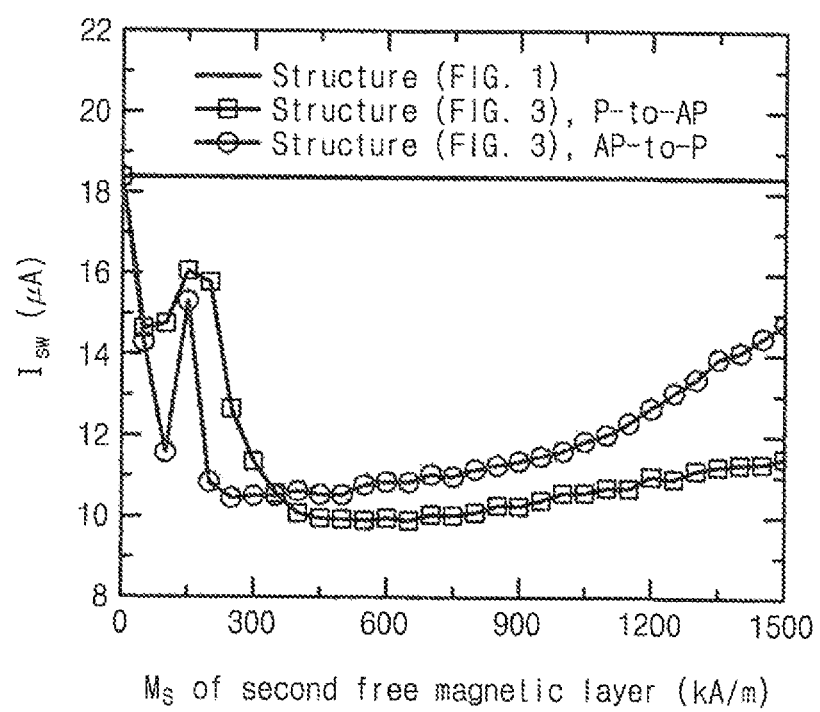
FIG. 8A is a graph showing a switching current density of a magnetic memory device having the structure of FIG. 1 and a switching current according to a saturation magnetization value of a second free magnetic layer of a magnetic memory device having the structure of FIG. 3.

The following FIG. 8A is a graph showing a switching current and a distribution of the magnetic memory device having the conventional structure (FIG. 1) and a switching current according to a saturation magnetization value of the second free magnetic layer 305 in the magnetic memory device having the new structure (FIG. 3).

Referring to the following FIG. 8A, a switching current is varied depending on the saturation magnetization value ($M_{S2}$) of the second free magnetic layer 305 having the horizontal anisotropy. According to the present experimental example, the switching current of the magnetic memory device of the new structure (FIG. 3) according to the present invention is always lower than a value of the conventional structure (FIG. 1) shown by a black full line regardless of the saturation magnetization value of the second free magnetic layer 305. In particular, it is confirmed that the reduction effect of the switching current is the greatest when the $M_{S2}$ is in a range of 300~500 kA/m.

Figure 8B:
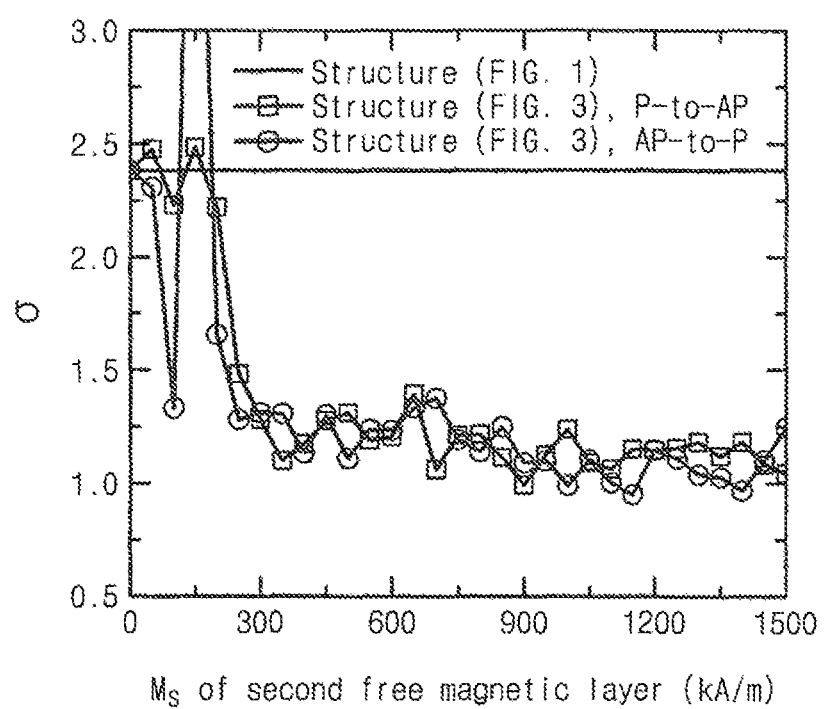
FIG. 8B is a graph showing a distribution chart of a switching current density of a magnetic memory device having the structure of FIG. 1 and a distribution chart of a switching current density according to a saturation magnetization value of a second free magnetic layer of a magnetic memory device having the structure of FIG. 3

Also, the following FIG. 8B is a graph showing a distribution of a switching current of the magnetic memory device having the conventional structure (FIG. 1) and a distribution of a switching current according to a saturation magnetization value of the second free magnetic layer 305 of the magnetic memory device having the structure (FIG. 3) according to the present invention.

Referring to the following FIG. 8B, a tendency similar to the switching current value illustrated above is shown. It is confirmed that the magnetic memory device applied with the new structure according to the present invention has a switching current distribution lower than that of the conventional structure. In particular, the switching current distribution is reduced by about 50% when the $M_{S2}$ is 300 kA/m or more.

INDUSTRIAL APPLICABILITY

As described above, the magnetic memory device having the new structure according to the present invention effectively reduces the switching current and the distribution by the second free magnetic layer 305 having the horizontal magnetization and the saturation magnetization value equal to or greater than a certain value, as compared with the conventional structure.

What is claimed is:

1. A magnetic memory device comprising:
a first fixed magnetic layer;
a first free magnetic layer;
a second free magnetic layer;
a second fixed magnetic layer;
a first non-magnetic layer disposed between the first fixed magnetic layer and the first free magnetic layer;
a second non-magnetic layer disposed between the first free magnetic layer and the second free magnetic layer; and
a third non-magnetic layer between the second free magnetic layer and the second fixed magnetic layer,
wherein the first fixed magnetic layer is a thin layer formed of a material that has a fixed magnetization direction and that is magnetized in a perpendicular direction to a plane of the first fixed magnetic layer,
wherein the first free magnetic layer is a thin layer formed of a material that has a magnetization direction which can be changed by an applied current and that is magnetized in a perpendicular direction to a plane of the first free magnetic layer,
wherein the second free magnetic layer is a thin layer formed of a material that has a magnetization direction which can be changed by an applied current and that is magnetized in a horizontal direction to a plane of the second free magnetic layer,
wherein the second fixed magnetic layer is a thin layer formed of a material that has a fixed magnetization direction opposite to the first fixed magnetic layer and that is magnetized in a perpendicular direction to a plane of the second fixed magnetic layer, and
wherein a saturation magnetization value of the material magnetized in the horizontal direction is in a range of 300-2000 kA/m.

2. The magnetic memory device of claim 1, wherein the first fixed magnetic layer and the second fixed magnetic layer are each comprising a material selected from a group consisting of Fe, Co, Ni, B, Si, Zr, Pt, Pd, and a mixture thereof.

3. The magnetic memory device of claim 2, wherein the first fixed magnetic layer and the second fixed magnetic layer are a multi-thin layer comprising n stacked double layer (n≥1), respectively,
wherein the double layer comprises an X layer and a Y layer, and
wherein the X layer and the Y layer are each comprising material selected from a group consisting of Fe, Co, Ni, B, Si, Tb, Zr, Pt, Pd, and a mixture thereof.

4. A magnetic memory device comprising:
a first fixed magnetic layer;
a first free magnetic layer;
a second free magnetic layer;
a second fixed magnetic layer;
a first nonmagnetic layer disposed between the first fixed magnetic layer and the first free magnetic layer;
a second non-magnetic layer disposed between the first free magnetic layer and the second free magnetic layer; and
a third non-magnetic layer between the second free magnetic layer and the second fixed magnetic layer,
wherein the first fixed magnetic layer is a thin layer formed of a material that has a fixed magnetization direction and that is magnetized in a perpendicular direction to a plane of the first fixed magnetic layer,
wherein the first free magnetic layer is a thin layer formed of a material that has a magnetization direction which can be changes by an applied current and that is magnetized in a perpendicular direction to a plane of the first free magnetic layer,
wherein the second free magnetic layer is a thin layer formed of a material that has a magnetization direction which can be changed by an applied current and that is magnetized in a horizontal direction to a plane of the second free magnetic layer,
wherein the second fixed magnetic layer is a thin layer formed of a material that has a fixed magnetization direction opposite to the first fixed magnetic layer and that is magnetized in a perpendicular direction to a plane of the second fixed magnetic layer,
wherein at least one of the first fixed magnetic layer and the second fixed magnetic layer has an anti-magnetic structure comprising a first magnetic layer, a non-magnetic layer and a second magnetic layer, and wherein the first magnetic layer and the second magnetic layer are each comprising material selected from a group consisting of Fe, Co, Ni, B, Si, Zr, Pt, Pd, and a mixture thereof.

5. The magnetic memory device of claim 4, wherein at least one of the first magnetic layer and the second magnetic layer is a multi-thin layer comprising n stacked double layer (n≥1),
wherein the double layer comprises an X layer and a Y layer, and
wherein the X layer and the Y layer are each comprising material selected from a group consisting of Fe, Co, Ni, B, Si, Zr, Pt, Pd, and a mixture thereof.

6. A magnetic memory device comprising:
first fixed magnetic layer;
a first free magnetic layer;
a second free magnetic layer;
a second fixed magnetic layer;
a first non-magnetic layer disposed between the first fixed magnetic layer and the first free magnetic layer;
a second non-magnetic layer disposed between the first free magnetic layer and the second free magnetic layer; and
a third non-magnetic layer between the second free magnetic layer and the second fixed magnetic layer,
wherein the first fixed magnetic layer is a thin layer formed of a material that has a fixed magnetization direction and that is magnetized in a perpendicular direction to a plane of the first fixed magnetic layer,
wherein the first free magnetic layer is a thin layer formed of a material that has a magnetization direction which can be changed by an applied current and that is magnetized in a perpendicular direction to a plane of the first free magnetic layer,
wherein the second free magnetic layer is a thin layer formed of a material that has a magnetization direction which can be changed by an applied current and that is magnetized in a horizontal direction to a plane of the second free magnetic layer,
wherein the second fixed magnetic layer is a thin layer formed of a material that has a fixed magnetization direction opposite to the first fixed magnetic layer and that is magnetized in a perpendicular direction to a plane of the second fixed magnetic layer,
wherein at least one of the first fixed magnetic layer and the second fixed magnetic layer has an exchange biased anti-magnetic structure comprising an antiferromagnetic layer, a first magnetic layer, a non-magnetic layer and a second magnetic layer,
wherein the antiferromagnetic layer comprises a material selected from a group consisting of Ir, Pt, Mn, and a mixture thereof, and
wherein the first magnetic layer and the second magnetic layer are each comprising material selected from a group consisting of Fe, Co, Ni, B, Si, Zr, Pt, Pd, and a mixture thereof.

7. The magnetic memory device of claim 6, wherein at least one of the first magnetic layer and the second magnetic layer is a multi-thin layer comprising n stacked double layer (n≥1),
wherein the double layer comprises an X layer and a Y layer, and
wherein the X layer and the Y layer are each comprising material selected from a group consisting of Fe, Co, Ni, B, Si, Zr, Pt, Pd, and a mixture thereof.

8. The magnetic memory device of claim 1, wherein the first fixed magnetic layer and the second fixed magnetic layer comprise different materials from each other and have different multi-thin layer structures from each other.

9. The magnetic memory device of claim 1, wherein the first non-magnetic layer, the second non-magnetic layer and the third non-magnetic layer comprise different materials from each other, and
wherein the first non-magnetic layer, the second non-magnetic layer and the third non-magnetic layer are each comprising a material selected from a group consisting of Ru, Cu, Al, Ta, Au, Ag, AlO$_x$, MgO, TaO$_x$, ZrO$_x$, and a mixture thereof.

10. The magnetic memory device of claim 1, wherein electrical conductivities of the first non-magnetic layer, the second non-magnetic layer and the third non-magnetic layer are higher than those of the first fixed magnetic layer, the first free magnetic layer, the second free magnetic layer and the second fixed magnetic layer.

11. The magnetic memory device of claim 1, wherein electrical conductivities of the first non-magnetic layer, the second non-magnetic layer and the third non-magnetic layer are lower than those of the first fixed magnetic layer, the first free magnetic layer, the second free magnetic layer and the second fixed magnetic layer.

12. The magnetic memory device of claim 1, wherein the saturation magnetization value of the material magnetized in the horizontal direction is in a range of 300-500 kA/m.

13. The magnetic memory device of claim 4, wherein a saturation magnetization value of the material magnetized in the horizontal direction is in a range of 300-2000 kA/m.

14. The magnetic memory device of claim 4, wherein electrical conductivities of the first non-magnetic layer, the second non-magnetic layer and the third non-magnetic layer are higher than those of the first fixed magnetic layer, the first free magnetic layer, the second free magnetic layer and the second fixed magnetic layer.

15. The magnetic memory device of claim 4, wherein electrical conductivities of the first non-magnetic layer, the second non-magnetic layer and the third non-magnetic layer are lower than those of the first fixed magnetic layer, the first free magnetic layer, the second free magnetic layer and the second fixed magnetic layer.

16. The magnetic memory device of claim 4, wherein the first fixed magnetic layer and the second fixed magnetic layer comprise different materials from each other and have different multi-thin layer structures from each other.

17. The magnetic memory device of claim 6, wherein a saturation magnetization value of the material magnetized in the horizontal direction is in a range of 300-2000 kA/m.

18. The magnetic memory device of claim 6, wherein electrical conductivities of the first non-magnetic layer, the second non-magnetic layer and the third non-magnetic layer are higher than those of the first fixed magnetic layer, the first free magnetic layer, the second free magnetic layer and the second fixed magnetic layer.

19. The magnetic memory device of claim 6, wherein electrical conductivities of the first non-magnetic layer, the second non-magnetic layer and the third non-magnetic layer are lower than those of the first fixed magnetic layer, the first free magnetic layer, the second free magnetic layer and the second fixed magnetic layer.

20. The magnetic memory device of claim 6, wherein the first fixed magnetic layer and the second fixed magnetic layer comprise different materials from each other and have different multi-thin layer structures from each other.

* * * * *